United States Patent
Zeng

(10) Patent No.: US 10,078,235 B2
(45) Date of Patent: Sep. 18, 2018

(54) DISPLAY DEVICE AND PURE COLOR SCREEN INSPECTION METHOD THEREOF

(71) Applicant: SHENZHEN CHINA STAR OPTOELECTRONICS TECHNOLOGY CO., LTD., Shenzhen, Guangdong (CN)

(72) Inventor: Mian Zeng, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 118 days.

(21) Appl. No.: 15/327,999

(22) PCT Filed: Jan. 6, 2017

(86) PCT No.: PCT/CN2017/070465
§ 371 (c)(1),
(2) Date: Jan. 20, 2017

(87) PCT Pub. No.: WO2018/113048
PCT Pub. Date: Jun. 28, 2018

(65) Prior Publication Data
US 2018/0203273 A1   Jul. 19, 2018

(30) Foreign Application Priority Data
Dec. 23, 2016   (CN) .......................... 2016 1 1206293

(51) Int. Cl.
G02F 1/133   (2006.01)
G09G 3/36   (2006.01)
H01L 27/32   (2006.01)
G02F 1/1343   (2006.01)
G02F 1/1362   (2006.01)

(52) U.S. Cl.
CPC ........ *G02F 1/13306* (2013.01); *G02F 1/1343* (2013.01); *G02F 1/136286* (2013.01); *G09G 3/3611* (2013.01); *H01L 27/3288* (2013.01)

(58) Field of Classification Search
CPC ............... G02F 1/13306; G02F 1/1343; G02F 1/136286; G09G 3/3611; H01L 27/3288
See application file for complete search history.

(56) References Cited

U.S. PATENT DOCUMENTS

2010/0097366 A1* 4/2010 Kitayama ............ G09G 3/3614
                                                              345/213
2016/0329354 A1* 11/2016 Li ........................ G02F 1/1335

* cited by examiner

*Primary Examiner* — Abhishek Sarma
(74) *Attorney, Agent, or Firm* — Muncy, Geissler, Olds & Lowe, P.C.

(57) ABSTRACT

A pure color screen inspection method for a display panel is provided. The method includes selecting the sub-pixels of an undetected color; turning on the gate electrodes of odd row using a first scan line; providing a data signal to the sub-pixels of odd row using a corresponding data line; turning on the gate electrodes of even row using a second scan line; providing a data signal to the sub-pixels of even row using a corresponding data line; and repeating above steps. The beneficial effects of the method are that a display panel can be lighted up with a pure color screen without mixed colors via a printed circuit board.

16 Claims, 3 Drawing Sheets

DISPLAY DEVICE AND PURE COLOR SCREEN INSPECTION METHOD THEREOF

TECHNICAL FIELD OF THE DISCLOSURE

The present invention relates to a liquid crystal display technology, and more particularly, to a display device and a pure color screen inspection method for the display device.

BACKGROUND OF THE DISCLOSURE

In an existing display panel, the display panel is lighted up usually by a signal supplied via a test point. It is very different from directly using the module to light up the display panel by supplying a signal via a printed circuit board. The strength of the supplied signal in using the test point to supply signal to light up the display panel is apparently not as strong as that of the supplied signal in using the printed circuit board to supply signal. Moreover, the connection path is much longer, the load is much heavier, and the degradation of the signal is much faster. Therefore, the data signals supplied to the display panel for a test are generally leading to a positive frame in a direct current or are a low frequency signal. In this way, the signal is not distorted too much after arrives the pixel on the display panel so that the display panel can be normally lighted up for defect inspection.

In performing a test on an inversion design of pixel structure of the panel, if a signal of a positive frame in a direct current is directly supplied to a red, green, or blue test point, a screen of mixed color by red plus green, or green plus blue, or blue plus red will be lighted up. However, it is difficult to detect the defects such as bright and dark lines, color resistant defects, and red/green/blue uniform colors using the screen of mixed color. If the subject to be inspected is not a GOA (Gate Driver on Array) product, one can connect the gate electrodes of odd row together and then the even row together, turn on the gate electrodes of odd row to supply a low frequency signal of a positive frame to red test points, and then turn on the gate electrodes of even row to supply a low frequency signal of a positive frame to green test points so as to light up a red screen. However, for a GOA product, each row of gate electrodes corresponds to an output scan signal of each unit in a GOA electric circuit. The regular timing of GOA signals cannot carry out connecting the gate lines of odd row and even row individually as the same as the non-GOA product does. Therefore, for the GOA product, it is hard to light up a pure color screen of red, green, or blue color for the defect inspection on the display panel.

Above all, in inspecting a screen of a GOA display panel in the existing skills, a screen of mixed colors of red plus green, or green plus blue, or blue plus red will appear when a module is used to inspect a screen of a pure color and turn on the same via a printed circuit board, and therefore the dead pixel on the screen cannot be accurately detected.

SUMMARY OF THE DISCLOSURE

The present invention provides a pure color screen inspection method for a display device, which can light up a GOA display panel with a pure color screen without mixed colors via a printed circuit board, thereby improving the accuracy of inspection on a display panel.

To solve above technical problems, the technical schemes provide in the present invention are described below.

The present invention provides a pure color screen inspection method for a display device, wherein the display device comprises a scan driving module, a data driving module, a thin film transistor array substrate, a scan line group, and a data line group, the thin film transistor array substrate has pixels disposed on a surface thereof, the pixel comprises a first sub-pixel, a second sub-pixel, and a third sub-pixel arranged in order from left to right, the first sub-pixel is a red sub-pixel, the second sub-pixel is a green sub-pixel, and the third sub-pixel is a blue sub-pixel; the scan line group comprises: a first scan line connected to the pixels of an odd row; and a second scan line connected to the pixels of an even row; the data line group comprises: a first data line connected to the first sub-pixels of the odd row; a second data line connected to the first sub-pixels of the even row and the second sub-pixels of the odd row; a third data line connected to the second sub-pixels of the even row and the third sub-pixels of the odd row; and a fourth data line connected to the third sub-pixels of the even row, the method comprising steps of: Step one: selecting the sub-pixels of an undetected color as target color sub-pixels according to an arrange order of the sub-pixels; Step two: generating a first scan signal by the scan driving module and transmitting the first scan signal to the first scan line; Step three: generating a first data signal by the data driving module and transmitting the first data signal to a data line connected to the target color sub-pixels of the odd row; Step four: generating a second scan signal by the scan driving module and transmitting the second scan signal to the second scan line; Step five: generating a second data signal by the data driving module and transmitting the second data signal to a data line connected to the target color sub-pixels of the even row; and Step six: repeating Step one to Step five all pure color detection of the display device is completed.

In accordance with a preferred embodiment of the present invention, the first sub-pixel is a red sub-pixel, the second sub-pixel is a blue sub-pixel, and the third sub-pixel is a green sub-pixel.

In accordance with a preferred embodiment of the present invention, the pixel further comprises a fourth sub-pixel, the data line group further comprises a fifth data line, the fourth data line is connected to the fourth sub-pixels of the odd row, and the fifth data line is connected to the fourth sub-pixels of the even row.

In accordance with a preferred embodiment of the present invention, the first sub-pixel is a red sub-pixel, the second sub-pixel is a green sub-pixel, the third sub-pixel is a blue sub-pixel, and the fourth sub-pixel is a white sub-pixel.

In accordance with a preferred embodiment of the present invention, the first sub-pixel is a red sub-pixel, the second sub-pixel is a green sub-pixel, the third sub-pixel is a blue sub-pixel, and the fourth sub-pixel is a yellow sub-pixel.

In accordance with a preferred embodiment of the present invention, the display device is a liquid crystal display panel.

In accordance with a preferred embodiment of the present invention, the display device is an OLED (Organic Light-Emitting Diode) display screen.

The present invention further provides a pure color screen inspection method for a display device, wherein the display device comprises a scan driving module, a data driving module, a thin film transistor array substrate, a scan line group, and a data line group, the thin film transistor array substrate has pixels disposed on a surface thereof, the pixel comprises a first sub-pixel, a second sub-pixel, and a third sub-pixel; the scan line group comprises: a first scan line connected to the pixels of an odd row; and a second scan line connected to the pixels of an even row; the data line group comprises: a first data line connected to the first sub-pixels of the odd row; a second data line connected to the first sub-pixels of the even row and the second sub-pixels of the odd row; a third data line connected to the second sub-pixels of the even row and the third sub-pixels of the odd row; and a fourth data line connected to the third sub-pixels of the even row, the method comprising steps of: Step one: selecting the sub-pixels of an undetected color as target color sub-pixels according to an arrange order of the sub-pixels; Step two: generating a first scan signal by the scan driving module and transmitting the first scan signal to the first scan line; Step three: generating a first data signal by the data driving module and transmitting the first data signal to a data line connected to the target color sub-pixels of the odd row; Step four: generating a second scan signal by the scan driving module and transmitting the second scan signal to the second scan line; Step five: generating a second data signal by the data driving module and transmitting the second data signal to a data line connected to the target color sub-pixels of the even row; and Step six: repeating Step one to Step five all pure color detection of the display device is completed.

In accordance with a preferred embodiment of the present invention, the first sub-pixel is a red sub-pixel, the second sub-pixel is a blue sub-pixel, and the third sub-pixel is a green sub-pixel.

In accordance with a preferred embodiment of the present invention, the pixel further comprises a fourth sub-pixel, the data line group further comprises a fifth data line, the fourth data line is connected to the fourth sub-pixels of the odd row, and the fifth data line is connected to the fourth sub-pixels of the even row.

In accordance with a preferred embodiment of the present invention, the first sub-pixel is a red sub-pixel, the second sub-pixel is a green sub-pixel, the third sub-pixel is a blue sub-pixel, and the fourth sub-pixel is a white sub-pixel.

In accordance with a preferred embodiment of the present invention, the first sub-pixel is a red sub-pixel, the second sub-pixel is a green sub-pixel, the third sub-pixel is a blue sub-pixel, and the fourth sub-pixel is a yellow sub-pixel.

In accordance with a preferred embodiment of the present invention, the display device is a liquid crystal display panel.

In accordance with a preferred embodiment of the present invention, the display device is an OLED (Organic Light-Emitting Diode) display screen.

According to above objective of the present invention, the present invention provides a display device, wherein the display device comprises a scan driving module, a data driving module, a thin film transistor array substrate, a scan line group, and a data line group, the thin film transistor array substrate has pixels disposed on a surface thereof, and the pixel includes a first sub-pixel, a second sub-pixel, and a third sub-pixel; the scan line group comprising: a first scan line connected to the pixels of an odd row; and a second scan line connected to the pixels of an even row; the data line group comprising: a first data line connected to the first sub-pixels of the odd row; a second data line connected to the first sub-pixels of the even row and the second sub-pixels of the odd row; a third data line connected to the second sub-pixels of the even row and the third sub-pixels of the odd row; and a fourth data line connected to the third sub-pixels of the even row; wherein when a pure color screen of any color is required to be displayed, the pure color screen is displayed with two half frames; wherein in a previous half frame, the scan driving module generates a first scan signal and transmits the first scan signal to the first scan line, and meanwhile the data driving module generates a first data signal and transmits the first data signal to a data line connected to the target color sub-pixels of the odd row; wherein in a later half frame, the scan driving module generates a second scan signal and transmits the second scan signal to the second scan line, and meanwhile the data driving module generates a second data signal and transmits the second data signal to a data line connected to the target color sub-pixels of the even row.

In accordance with a preferred embodiment of the present invention, the first sub-pixel is a red sub-pixel, the second sub-pixel is a blue sub-pixel, and the third sub-pixel is a green sub-pixel.

In accordance with a preferred embodiment of the present invention, the pixel further comprises a fourth sub-pixel, the data line group further comprises a fifth data line, the fourth data line is connected to the fourth sub-pixels of the odd row, and the fifth data line is connected to the fourth sub-pixels of the even row.

In accordance with a preferred embodiment of the present invention, the first sub-pixel is a red sub-pixel, the second sub-pixel is a green sub-pixel, the third sub-pixel is a blue sub-pixel, and the fourth sub-pixel is a white sub-pixel.

In accordance with a preferred embodiment of the present invention, the first sub-pixel is a red sub-pixel, the second sub-pixel is a green sub-pixel, the third sub-pixel is a blue sub-pixel, and the fourth sub-pixel is a yellow sub-pixel.

In accordance with a preferred embodiment of the present invention, the display device is a liquid crystal display panel.

In accordance with a preferred embodiment of the present invention, the display device is an OLED (Organic Light-Emitting Diode) display screen.

The beneficial effects of the present invention are that compared to the existing GOA display panel inspection, the inspection method of the present invention can light up a GOA display panel with a pure color screen without mixed colors via a printed circuit board, thereby improving the accuracy of inspection on a display panel.

BRIEF DESCRIPTION OF THE DRAWINGS

For a better understanding of technical schemes of the existing skills or the embodiments, the attached figures required to be used to illustrate the existing skills or the embodiments are introduced briefly. Apparently, the following figures only represent some embodiments of the present invention, the persons with ordinary skill in the art to which the subject invention pertains will more readily understand and obtain other attached figures based on these attached figures without any creative effort.

DETAILED DESCRIPTION OF THE DISCLOSURE

The following descriptions for the respective embodiments are specific embodiments capable of being implemented for illustrations of the present invention with referring to appending figures. In describing the present invention, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present invention for ease of understanding, but are not intended to limit the present invention. In the appending drawings, units with similar structures are indicated by the same reference numbers.

In inspecting a screen of a GOA (Gate Driver on Array) display panel in the existing skills, a screen of mixed colors of red plus green, or green plus blue, or blue plus red will appear when a module is used to inspect a screen of a pure color and turn on the same via a printed circuit board, and therefore the dead pixel on the screen cannot be accurately detected. As per this technical problem, the present invention can solve the drawbacks.

Figure 1:
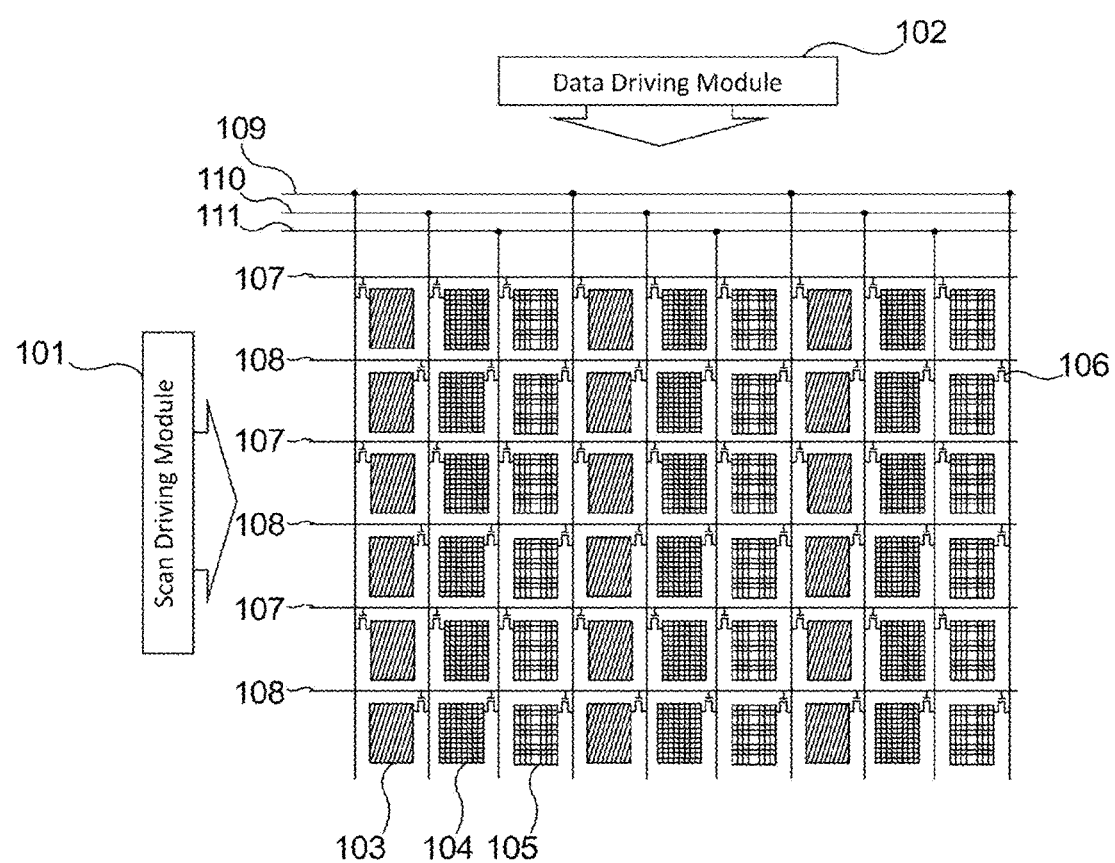
FIG. 1 is a schematic structural diagram showing a part of structure of an existing GOA display panel.

FIG. 1 is a schematic structural diagram showing a part of structure of an existing GOA display panel.

As shown in FIG. 1, the display panel comprises a scan driving module 101, a data driving module 102, a thin film transistor array substrate, a scan line group, and a data line group. The thin film transistor array substrate has a plurality of pixels disposed on a surface thereof. The pixel includes a first sub-pixel 103, a second sub-pixel 104, and a third sub-pixel 105. Each sub-pixel is correspondingly connected to a thin film transistor 106. The scan driving module 101 is configured to generate a scan signal (or a gate signal), which is transmitted to the scan line group by the scan driving module 101. The data driving module 102 is configured to generate a data signal, which is transmitted to the data line group by the data driving module 102. The scan line is coupled to the pixel as well as the data line is coupled to the pixel.

The scan line group includes a first scan line 107 connected to the pixels of an odd row and a second scan line 108 connected to the pixels of an even row. The data line group includes a first data line 109 connected to the first sub-pixels 103 of the odd row, a second data line 110 connected to the first sub-pixels 103 of the even row and the second sub-pixels 104 of the odd row, a third data line 111 connected to the second sub-pixels 104 of the even row and the third sub-pixels 105 of the odd row, and a fourth data line connected to the third sub-pixels 105 of the even row.

For the sub-pixels on a same column, the sub-pixels of the odd row and the sub-pixels of the even row are connected to different data lines. In such a connection, when the sub-pixels required to be lighted up are turned on, precharge of the sub-pixels sharing a same data line with the aforesaid sub-pixels can be carried out at the same time so as to prevent the liquid crystal from suffering instantaneous driving, resulting in an inaccurate twist angle of the liquid crystal. Therefore, when a screen of a pure color corresponding to the color of the first sub-pixels 103 (for example) is required to be lighted up, it needs to turn on all of the thin film transistors 106 on the array substrate, and meanwhile the data signal is transmitted to all of the data lines correspondingly connected to the first sub-pixels 103 such that all of the first sub-pixels 103 are lighted up. However, some of the sub-pixels in another color sharing a same data line with the first sub-pixels 103 will be lighted up, too. This causes a screen of mixed color, and it is thus difficult to recognize the dead pixel on the screen.

Figure 2:
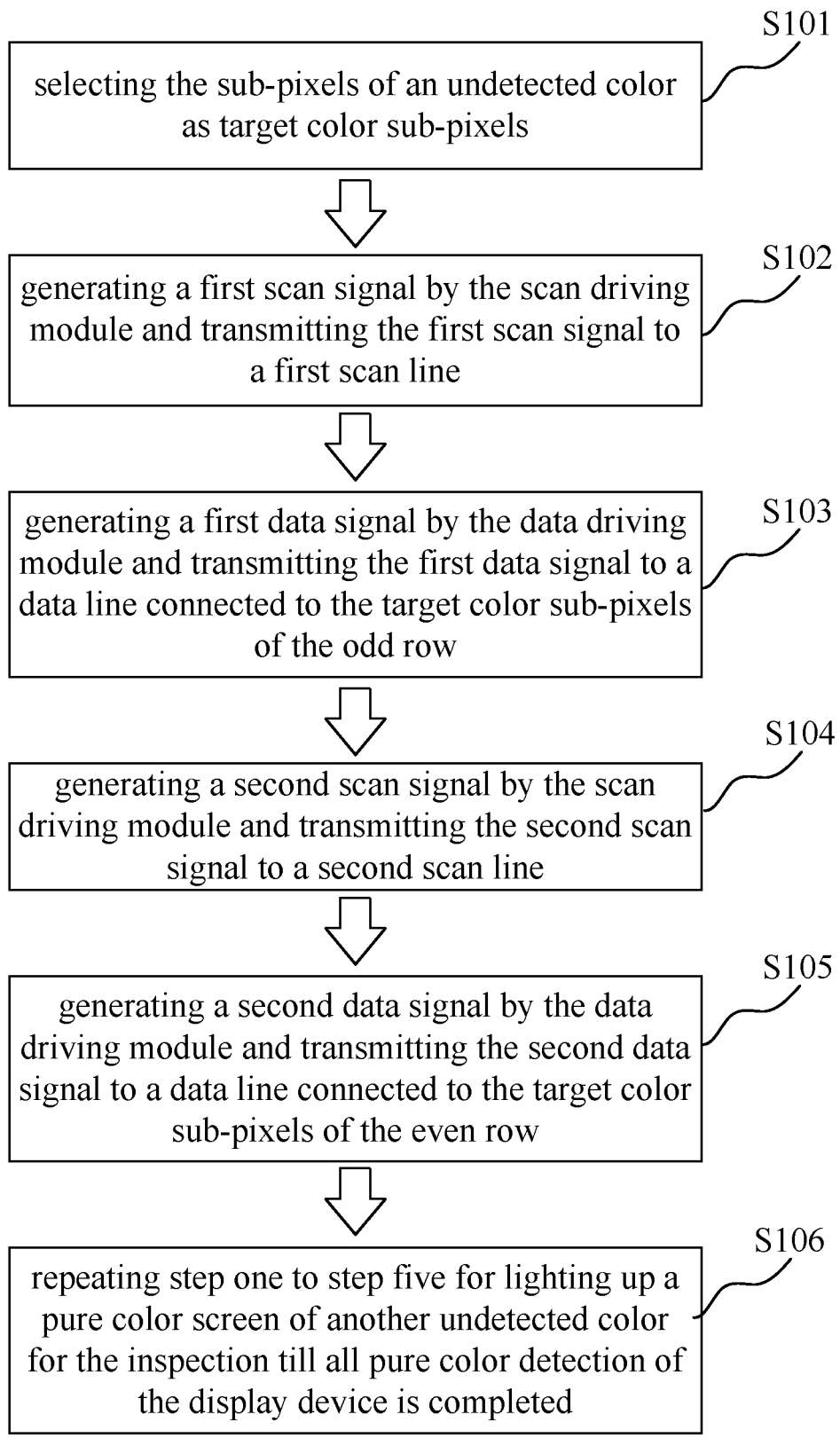
FIG. 2 is a flow chart of a pure color screen inspection method for a GOA display panel in accordance with the present invention.
Figure 3:
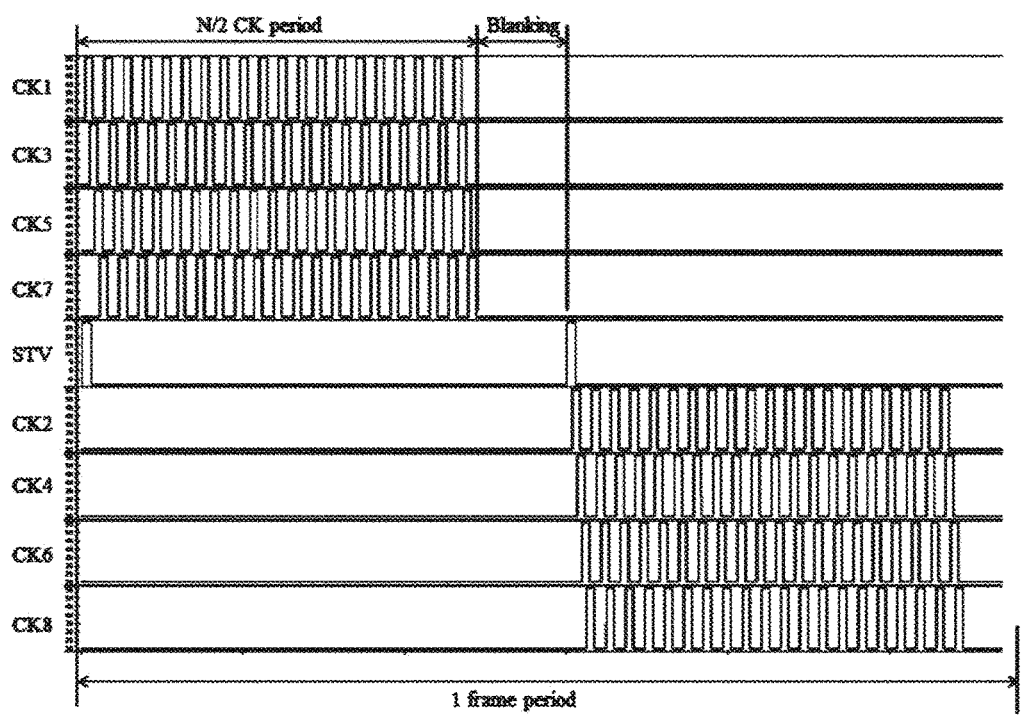
FIG. 3 is a diagram showing driving signal waveforms in a GOA display panel in accordance with the present invention.

FIG. 2 is a flow chart of a pure color screen inspection method for a GOA display panel in accordance with the present invention.

As shown in FIG. 2, the pure color screen inspection method includes the following steps.

Step S101: selecting the sub-pixels of an undetected color as target color sub-pixels;

In Step S101, the selection can be made without following the arrange order of the sub-pixels in selecting the undetected color.

Step S102: generating a first scan signal by the scan driving module and transmitting the first scan signal to a first scan line.

In Step S102, the first scan line turns on all of the thin film transistor of the odd row.

Step S103: generating a first data signal by the data driving module and transmitting the first data signal to a data line connected to the target color sub-pixels of the odd row.

In Step S103, the data line transmits a display signal to the sub-pixels corresponding to the odd row for lighting up the corresponding sub-pixels.

Step S104: generating a second scan signal by the scan driving module and transmitting the second scan signal to a second scan line.

In Step S104, the second scan line turns on all of the thin film transistors of the even row.

Step S105: generating a second data signal by the data driving module and transmitting the second data signal to a data line connected to the target color sub-pixels of the even row.

In Step S105, the data line transmits a display signal to the sub-pixels corresponding to the even row for lighting up the corresponding sub-pixels.

After Step S105 is finished, a pure color screen in a signal color is thus appeared. The dead pixel on a screen can thus be detected by human eye inspecting or even by inspecting with an image photographed via an instrument.

Step S106: repeating step one to step five for lighting up a pure color screen of another undetected color for the inspection till all pure color detection of the display device is completed.

In such a manner, the sub-pixels of the odd row and the sub-pixels of the even row are turned on individually. This can avoid turning on the sub-pixels of a color different from the target color, resulting in affecting purity of a pure color screen. Therefore, the efficiency in inspecting the display panel is improved as well as the accuracy of recognition of dead pixel.

In accordance with a preferred embodiment of the present invention, the first sub-pixel is a red sub-pixel, the second sub-pixel is a green sub-pixel, the third sub-pixel is a blue sub-pixel, and the red sub-pixel, the green sub-pixel, and the blue sub-pixel are arranged in order from left to right. Further in an example, the first sub-pixel is a red sub-pixel, the second sub-pixel is a blue sub-pixel, and the third sub-pixel is a green sub-pixel.

In accordance with another preferred embodiment of the present invention, the pixel further includes a fourth sub-pixel. The first sub-pixel, the second sub-pixel, the third sub-pixel, and the fourth sub-pixel are arranged in order from left to right. The data line group further includes a fifth data line. The fourth data line is connected to the fourth sub-pixels of the odd row and the fifth data line is connected to the fourth sub-pixels of the even row. In inspecting the pure color screen, the principle in lighting up the pure color screen in this embodiment is the same as the preliminary embodiment.

Preferably, the first sub-pixel is a red sub-pixel, the second sub-pixel is a green sub-pixel, the third sub-pixel is a blue sub-pixel, and the fourth sub-pixel is a white sub-pixel.

Preferably, the first sub-pixel is a red sub-pixel, the second sub-pixel is a green sub-pixel, the third sub-pixel is a blue sub-pixel, and the fourth sub-pixel is a yellow sub-pixel.

Preferably, the display device is a liquid crystal display panel.

Preferably, the display device is an OLED (Organic Light-Emitting Diode) display screen.

In accordance with above objectives, the present invention further provides a display device, which includes a scan driving module, a data driving module, a thin film transistor array substrate, a scan line group, and a data line group. The thin film transistor array substrate has pixels disposed on a surface thereof. The pixel includes a first sub-pixel, a second sub-pixel, and a third sub-pixel. The scan line group includes a first scan line connected to the pixels of an odd row and a second scan line connected to the pixels of an even row. The data line group includes a first data line connected to the first sub-pixels of the odd row, a second data line connected to the first sub-pixels of the even row and the second sub-pixels of the odd row, a third data line connected to the second sub-pixels of the even row and the third sub-pixels of the odd row, and a fourth data line connected to the third sub-pixels of the even row. When a pure color screen of any color is required to be displayed, the pure color screen is displayed with two half frames. In a previous half frame, the scan driving module generates a first scan signal and transmits the first scan signal to the first scan line, and meanwhile the data driving module generates a first data signal and transmits the first data signal to a data line connected to the target color sub-pixels of the odd row. In a later half frame, the scan driving module generates a second scan signal and transmits the second scan signal to the second scan line, and meanwhile the data driving module generates a second data signal and transmits the second data signal to a data line connected to the target color sub-pixels of the even row.

The principles of the display device of the present preferred embodiment are consistent with that of the pure color screen inspection method for the display device of the afore-described preferred embodiment. Please refer to the principles of the pure color screen inspection method for the display device of the afore-described preferred embodiment, which are not repeated herein.

The beneficial effects of the present invention are described below. Compared to the existing GOA display panel inspection, the inspection method of the present invention can light up a GOA display panel with a pure color screen without mixed colors via a printed circuit board, thereby improving the accuracy of inspection on a display panel.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A pure color screen inspection method for a display device, wherein the display device comprises a scan driving module, a data driving module, a thin film transistor array substrate, a scan line group, and a data line group, the thin film transistor array substrate has pixels disposed on a surface thereof, the pixel comprises a first sub-pixel, a second sub-pixel, and a third sub-pixel arranged in order from left to right, the first sub-pixel is a red sub-pixel, the second sub-pixel is a green sub-pixel, and the third sub-pixel is a blue sub-pixel;

the scan line group comprises: a first scan line connected to the pixels of an odd row; and a second scan line connected to the pixels of an even row;

the data line group comprises: a first data line connected to the first sub-pixels of the odd row; a second data line connected to the first sub-pixels of the even row and the second sub-pixels of the odd row; a third data line connected to the second sub-pixels of the even row and the third sub-pixels of the odd row; and a fourth data line connected to the third sub-pixels of the even row, the method comprising steps of:

Step one: selecting the sub-pixels of an undetected color as target color sub-pixels according to an arranged order of the sub-pixels;

Step two: generating a first scan signal by the scan driving module and transmitting the first scan signal to the first scan line;

Step three: generating a first data signal by the data driving module and transmitting the first data signal to a data line connected to the target color sub-pixels of the odd row;

Step four: generating a second scan signal by the scan driving module and transmitting the second scan signal to the second scan line;

Step five: generating a second data signal by the data driving module and transmitting the second data signal to a data line connected to the target color sub-pixels of the even row; and Step six: repeating Step one to Step five till all pure color detection of the display device is completed.

2. The method according to claim 1, wherein the first sub-pixel is a red sub-pixel, the second sub-pixel is a blue sub-pixel, and the third sub-pixel is a green sub-pixel.

3. The method according to claim 1, wherein the pixel further comprises a fourth sub-pixel, the data line group further comprises a fifth data line, the fourth data line is connected to the fourth sub-pixels of the odd row, and the fifth data line is connected to the fourth sub-pixels of the even row.

4. The method according to claim 3, wherein the first sub-pixel is a red sub-pixel, the second sub-pixel is a green sub-pixel, the third sub-pixel is a blue sub-pixel, and the fourth sub-pixel is a white sub-pixel.

5. The method according to claim 3, wherein the first sub-pixel is a red sub-pixel, the second sub-pixel is a green sub-pixel, the third sub-pixel is a blue sub-pixel, and the fourth sub-pixel is a yellow sub-pixel.

6. The method according to claim 1, wherein the display device is a liquid crystal display panel.

7. The method according to claim 1, wherein the display device is an OLED (Organic Light-Emitting Diode) display screen.

8. A pure color screen inspection method for a display device, wherein the display device comprises a scan driving module, a data driving module, a thin film transistor array substrate, a scan line group, and a data line group, the thin film transistor array substrate has pixels disposed on a surface thereof, the pixel comprises a first sub-pixel, a second sub-pixel, and a third sub-pixel;

the scan line group comprises: a first scan line connected to the pixels of an odd row; and a second scan line connected to the pixels of an even row;

the data line group comprises: a first data line connected to the first sub-pixels of the odd row; a second data line connected to the first sub-pixels of the even row and the second sub-pixels of the odd row; a third data line connected to the second sub-pixels of the even row and the third sub-pixels of the odd row; and a fourth data line connected to the third sub-pixels of the even row, the method comprising steps of:

Step one: selecting the sub-pixels of an undetected color as target color sub-pixels according to an arranged order of the sub-pixels;

Step two: generating a first scan signal by the scan driving module and transmitting the first scan signal to the first scan line;

Step three: generating a first data signal by the data driving module and transmitting the first data signal to a data line connected to the target color sub-pixels of the odd row;

Step four: generating a second scan signal by the scan driving module and transmitting the second scan signal to the second scan line;

Step five: generating a second data signal by the data driving module and transmitting the second data signal to a data line connected to the target color sub-pixels of the even row; and Step six: repeating Step one to Step five till all pure color detection of the display device is completed.

9. The method according to claim 8, wherein the first sub-pixel is a red sub-pixel, the second sub-pixel is a blue sub-pixel, and the third sub-pixel is a green sub-pixel.

10. The method according to claim 8, wherein the pixel further comprises a fourth sub-pixel, the data line group further comprises a fifth data line, the fourth data line is connected to the fourth sub-pixels of the odd row, and the fifth data line is connected to the fourth sub-pixels of the even row.

11. The method according to claim 10, wherein the first sub-pixel is a red sub-pixel, the second sub-pixel is a green sub-pixel, the third sub-pixel is a blue sub-pixel, and the fourth sub-pixel is a white sub-pixel.

12. The method according to claim 10, wherein the first sub-pixel is a red sub-pixel, the second sub-pixel is a green sub-pixel, the third sub-pixel is a blue sub-pixel, and the fourth sub-pixel is a yellow sub-pixel.

13. The method according to claim 8, wherein the display device is a liquid crystal display panel.

14. The method according to claim 8, wherein the display device is an OLED (Organic Light-Emitting Diode) display screen.

15. A display device, wherein the display device comprises a scan driving module, a data driving module, a thin film transistor array substrate, a scan line group, and a data line group, the thin film transistor array substrate has pixels disposed on a surface thereof, and the pixel includes a first sub-pixel, a second sub-pixel, and a third sub-pixel;

the scan line group comprising:
a first scan line connected to the pixels of an odd row; and
a second scan line connected to the pixels of an even row;

the data line group comprising:
a first data line connected to the first sub-pixels of the odd row;
a second data line connected to the first sub-pixels of the even row and the second sub-pixels of the odd row;
a third data line connected to the second sub-pixels of the even row and the third sub-pixels of the odd row; and
a fourth data line connected to the third sub-pixels of the even row;

wherein when a pure color screen of any color is required to be displayed, the pure color screen is displayed with two half frames;

wherein in a previous half frame, the scan driving module generates a first scan signal and transmits the first scan signal to the first scan line, and meanwhile the data driving module generates a first data signal and transmits the first data signal to a data line connected to the target color sub-pixels of the odd row;

wherein in a later half frame, the scan driving module generates a second scan signal and transmits the second scan signal to the second scan line, and meanwhile the data driving module generates a second data signal and transmits the second data signal to a data line connected to the target color sub-pixels of the even row.

16. The display device according to claim 15, wherein the first sub-pixel is a red sub-pixel, the second sub-pixel is a green sub-pixel, and the third sub-pixel is a blue sub-pixel.

* * * * *